United States Patent
Kwark

(10) Patent No.: US 6,967,483 B2
(45) Date of Patent: Nov. 22, 2005

(54) APPARATUS AND METHOD FOR DETERMINING CONTACT DYNAMICS

(75) Inventor: Young Hoon Kwark, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/831,296

(22) Filed: Apr. 26, 2004

(65) Prior Publication Data

US 2005/0237064 A1 Oct. 27, 2005

(51) Int. Cl.⁷ ............................................. G01R 31/02
(52) U.S. Cl. .................................................. 324/421
(58) Field of Search ............................... 324/415–424, 324/519, 522, 523, 527; 200/181, 600; 335/2

(56) References Cited

U.S. PATENT DOCUMENTS

| 4,933,641 A | * | 6/1990 | Hsiung et al. | ............... | 327/351 |
| 2004/0189319 A1 | * | 9/2004 | Stanisic et al. | ............. | 324/523 |

* cited by examiner

Primary Examiner—Vincent Q. Nguyen
(74) Attorney, Agent, or Firm—Greenblum & Bernstein, P.L.C.; Richard Ludwin

(57) ABSTRACT

The invention relates to an apparatus and method to determine contact dynamics between conductive surfaces, and more particularly to determine the dynamics of contact closure in mechanical switches and analysis of the dynamics of other mechanical systems, in general. A log amp is in electrical communication with the RF synthesizer via a transmission line. The log amp outputs a voltage converted from an envelope of an RF waveform to determine a capacitance between at least two conductive surfaces.

19 Claims, 6 Drawing Sheets

STATIONARY TEST FOR ECCENTRICITY

SCAN TO PROFILE SHAFT

ROTATING CAN DETERMINE DEFORMATION OF SHAFT

APPARATUS AND METHOD FOR DETERMINING CONTACT DYNAMICS

BACKGROUND OF THE INVENTION

1. Field of the Invention

The invention relates to an apparatus and method to determine contact dynamics between conductive surfaces, and more particularly to determine the dynamics of contact closure in mechanical switches and analysis of the dynamics of other mechanical systems, in general.

2. Background Description

Switches are currently used in a wide variety of applications ranging from simple light switches to advanced microelectronic components such as RF switches using MEMs technologies. For example, mechanical switches such as toggle switches, rocker switches, and the like are used in a wide variety of digital, analog, and power systems. Switch design is a well established discipline, however, two conductive contacts can collide and bounce back and forth until a steady-state occurs, that is, switch contact bounce, although recognized is not often characterized in detail due to lack of convenient low cost measurement methodology. This same effect can occur in a wide array of different switch contacts (e.g., relays, circuit breakers), and in general to the dynamics of any reasonably conductive surface over time.

Manufacturers and users of switches need to be able to characterize a switch's performance over its lifetime. This is to enable optimization of the entire system. Some parameters of interest include:

(i) How long it takes a switch to reach steady-state;
(ii) The number of times the contacts bounce with each switch closure and opening;
(iii) The exact time the switches are in contact with each other at steady-state; and/or
(iv) The degree of separation versus time to determine, for example, if one line will be energized before another for multipole configurations.

In digital systems each time the contacts bounce a separate electrical signal may be created resulting in several discrete events. These digital signals created by the bounce may result in malfunctions, false readings, and other effects to the system. To compensate for these effects, software routines are used to ignore extra signals during the period when the contacts are still bouncing. These "debouncing" software routines set a limit on how fast the switches can be activated, since if they are activated during the debounce period, they are ignored. Therefore, setting the duration of the debounce period is very important, and determining the statistical behavior of switch contact bounce assumes an important role.

Another switching application is in mechanical relay systems, that is, mechanical switches often used in high power systems. One such application is in high current circuit breakers used to protect wiring or the power distribution grid. In this type of system, the bounce of the contacts creates and/or prolongs the existence of an arc due to the high induced voltages that result when contact is broken. This plasma arc tends to pit and wear away the contact surfaces over time which, in turn, affects the lifetime of the contacts. Also, in circuit breakers, the arc represents circuit continuity that allows current to cross the switch even though it is open. Accordingly, a breaker designer needs to know the detailed dynamics of the breaker contacts over time in order to design a system that is capable of eliminating or extinguishing the arc using, for example, a high pressure inert gas jet. Also, in order to reduce the contact bounce in these systems, mechanical damping can be used. However, it is important to know the dynamics of the breaker contacts when using such a damping apparatus in order to evaluate its efficacy.

Techniques currently used to determine the dynamics of switch contacts during operation include, for example, high speed photography, optical interferometery, and accelerometers. However, each one of these techniques may be limited in its use to certain applications.

In high speed photography, high speed cameras may be utilized to photograph the contact of a switch over several cycles. These photographs can then be used to determine the dynamics of the contact during operation of the switch. However, while high speed photography equipment may be reliable, it tends to be very specialized and costly for this application. Moreover, the technique requires a high degree of setup. For example, when implementing high speed photography, optical access to the contacts is required. In a circuit breaker, a cut-away and installation of a transparent sidewall may have to be used to gain line of sight access. However, this may modify the electrical insulation properties of the switch itself.

At slower frame rates, for example, on the order of about 100 frames per second to about 1000 frames per second, strobe lights that have the desired repetition rate may be used to monitor the switch. In this type of configuration, line of sight access to the switch or the switching elements is still required. Also, this technique will not capture rapid mechanical movements, for example, on the microsecond time scale.

Another related art technique is optical interferometry. Optical interferometry uses interference patterns that result from reflections of a monochromatic light source such as a laser. This technique can be used to capture extremely precise measurements when there is a relatively slow motion, for example, measurements down to a fraction of a wavelength of the light may be captured. To use this type of system, a reflective surface is required in order to create an interference pattern. This technique is best utilized for extremely small distances that are outside the range of typical switching applications. Also, most conventional optical interferometers are designed for low speed movements rather than high speed movements that are present in switches. This technique also needs optical access to the moving contacts.

Another technique utilizes accelerometers to measure the acceleration of an object's mass. Typically, accelerometers include relatively massive reference mass in order to obtain good low frequency response. However, due to this relatively massive element, accelerometers are only able to sense the dynamics of larger (i.e., much more massive than the accelerometer) structures without corrupting the dynamics of the mechanical motion itself. That is, the weight of the accelerometer may affect the dynamics of a smaller structure, like a switch, resulting in an inaccurate portrayal of the switch dynamics. Thus, the accelerometer is typically used to measure vibrations of larger structures, for example, in an automobile, a building, an airplane or the like.

SUMMARY OF THE INVENTION

An apparatus according to an embodiment of the invention includes a radio frequency (RF) synthesizer outputting a frequency. A log amp is in electrical communication with the RF synthesizer via a transmission line. The log amp outputs a voltage converted from an envelope of an RF waveform to determine a capacitance between at least two conductive surfaces.

In another embodiment of the invention an apparatus is used to measure separation between at least two conductive surfaces. The apparatus includes a radio frequency synthesizer to generate a narrow bandwidth single frequency and a first transmission line in electrical communication with the radio frequency (RF) synthesizer. A testing unit is in electrical communication with the first transmission line and a second transmission line is in electrical communication with the testing unit. A log amp is in electrical communication with an output of the second transmission line, where the log amp outputs a voltage used to determine the separation between the at least two conductive surfaces of the testing unit.

In yet another embodiment of the invention a method is used to measure capacitance across at least two conductive surfaces. The method includes providing a movement between a first conductive surface and a second conductive surface. The method includes further, providing a high frequency signal across the first conductive surface and the second conductive surface and measuring the amplitude of the downstream signal at the second conductive surface. The measured frequency is converted to a voltage and translating the voltage into a waveform of capacitance versus time as the first conductive surface and the second conductive surface move with relation to one another to determine mechanical separation between the first conductive surface and the second conductive surface over a predetermined time period.

DETAILED DESCRIPTION OF EMBODIMENTS OF THE INVENTION

The invention is directed to, for example, an apparatus and method of non-invasively monitoring dynamics of a switch and other structural elements. In one exemplary embodiment, the invention provides an apparatus and method for measuring and calculating distances and other dynamics of a structural or acoustic system over time. The invention provides a system which does not require line of sight access or significant modification to any system that it is monitoring, and may be used to measure in-situ dynamics of elements, for example, during operation without system performance degradation. The invention is applicable in a wide variety of applications to improve and/or monitor a system's performance over time. For example, the apparatus may be used in a wide range of switching applications, structural dynamic applications, refinement of acoustic transducers, or the like.

Figure 1:
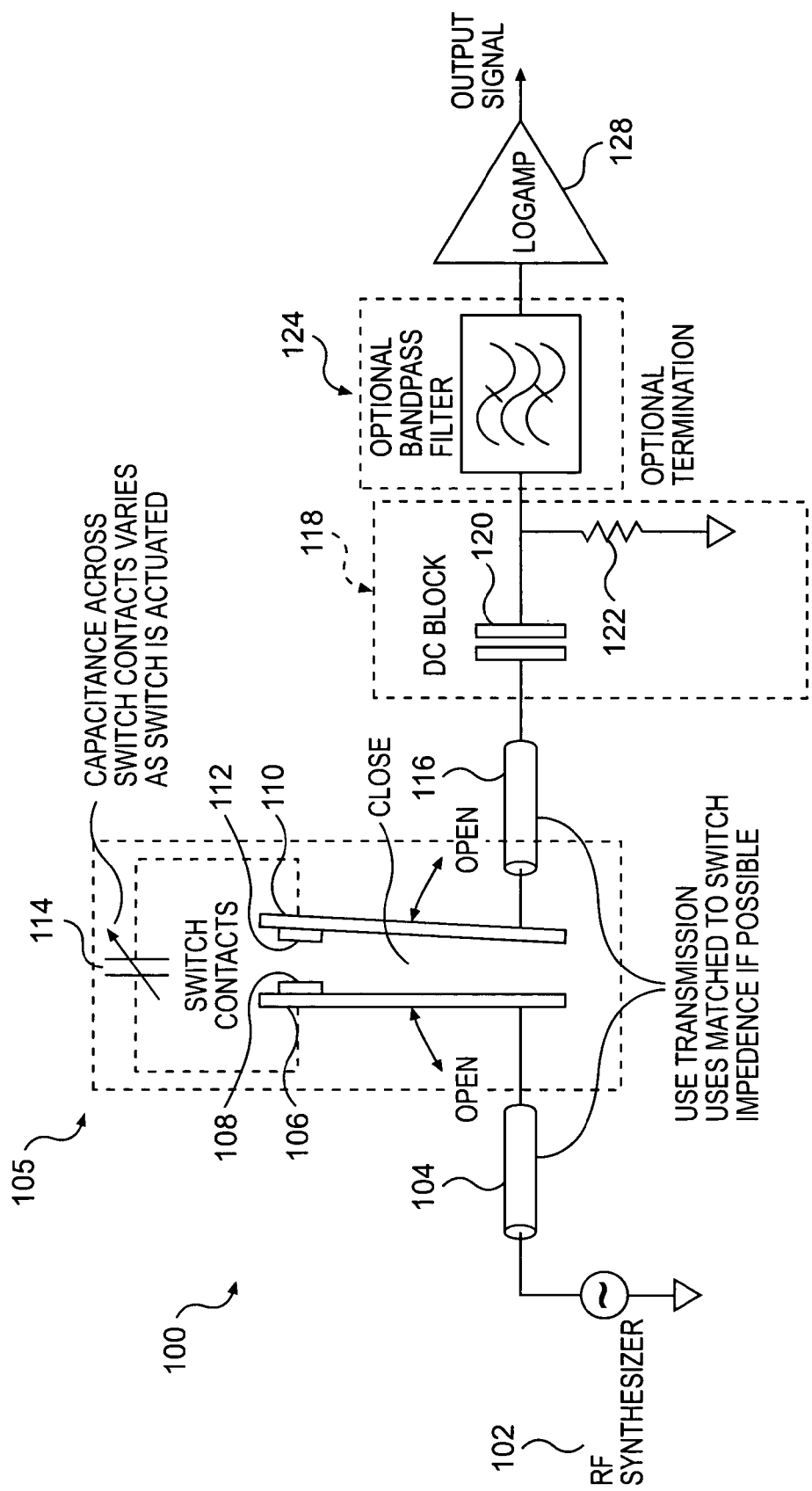
FIG. 1 shows an apparatus according to an embodiment of the invention.

FIG. 1 shows an apparatus according to an embodiment of the invention. The overall apparatus is generally depicted as reference numeral 100 and is designed to monitor the dynamics of switch contacts or other dynamic structures. This will allow a designer to understand the dynamics of a system and to optimize system components for example, by determining the duration of switch contact bounce. The circuit 100 includes an RF synthesizer 102, a first transmission line 104 in electrical communication with the RF synthesizer 102, and a test unit 105. The test unit 105 is representative of any type of apparatus to be tested by the system and method. For example, the test unit may be any type of system using two elements that change in orientation or separation over time such as the contacts of a toggle switch, for example. The test unit 105 is electrically connected to a second transmission line 116 which is in electrical communication with a log amplifier (log amp) 128. The transmission lines 104 and 116 can be replaced with less expensive cabling if the RF frequency is sufficiently low (e.g., several Megahertz).

In the embodiment of FIG. 1, the test unit 105 is a mechanical switch having a first switch arm 106 with a first conductive surface 108 and a second switch arm 110 with a second conductive surface 112. In operation, the first switch arm 106 and second switch arm 110 move from an open position to a closed position and vice versa with a bouncing phenomenon. A varying parasitic capacitance 114 is associated with the gap between the switch contacts (e.g., conductive surfaces) during all phases of operation and in particular during bouncing of the switch contacts. This capacitance will increase as the switch contacts approach each other and will decrease as they move further apart.

Optionally, the circuit 100 includes a protection unit 118 and a bandpass filter 124 disposed between the transmission line 116 and the log amp 128. The protection unit 118 may include a DC block 120 (a capacitor is shown, but a transformer can be used) and an optional resistive termination 122. In this configuration, the isolation unit 118 protects the log amp 128 against DC voltages that may be present on the switch contacts since this technique may be used while the switch or relay is still in an in-situ environment. More specifically, in one implementation, the log amp is a semiconductor device which has a limited range of DC input that it can tolerate, so the DC block will eliminate this consideration during the test. The reactance of the capacitor 120 must be sufficiently large at the RF frequency chosen so that it does not significantly attenuate the RF signal before it reaches the input of the log amp.

The embodiment of FIG. 1 further includes an optional bandpass filter 124. The bandpass filter 124 operates to remove noise in the circuit 100 and thus, improves monitoring performance of the circuit 100. More specifically, since the log amp 128 is sensitive to a large range of frequencies, such as, up to several hundred megahertzs or higher, noise in the circuit, whether thermal noise or noise from jammers, may interfere with the operation of the log amp 128. That is, if there is extraneous noise being injected into system, the log amp 128 may not be able to discriminate between the noise and the actual signal, thus creating difficulties in discerning a correct output of the log amp. The bandpass filter 124 only allows predetermined frequencies to pass through the circuit and reach the log amp 128. In preferred embodiments, these predetermined frequencies are matched to the RF synthesizer in order to optimize performance. Accordingly, the bandpass filter 126 allows the log amp 128 to process signals generated by the RF synthesizer substantially free from noise and, thus increasing system performance by improving the dynamic range of signals the log amp can measure.

In operation, the RF synthesizer 102 may be set to a wide range of frequencies, for example, frequencies ranging from about 1 megahertz to several hundred megahertz. It should be realized, though, that any number of frequencies may be used depending on other system parameters or other factors. These factors may include, for example, physical dimensions of the application, desired time resolution of the application, physical size of application, or the like. For example, smaller switches require higher RF frequencies and larger switches favor lower frequencies. In one implementation, the RF synthesizer may be configured to generate a single frequency of RF energy over the transmission line such that the signal reaching the input of the log amp when the switch contacts are in "mid-position", i.e., substantially halfway between open and closed, is centered in the dynamic range window of the log amp. If the input range of the log amp is from 0 dBm to −100 dBm, for example, then the RF frequency and RF amplitude of the synthesizer can be set so to produce −50 dBm at the input to the log amp in this configuration.

Another constraint on the choice of frequency may be related to a desired time resolution that is needed for the circuit 100. Typically, oversampling is desired, such as by a factor of ten above the highest mechanical frequency that is to be measured. In one embodiment, as the output of the log amp 128 responds to the outside envelope of the RF waveform the minimum frequency for the RF synthesizer may be set to at least 50 times higher than the highest mechanical frequency of interest.

In the embodiment of FIG. 1, the capacitance across the switch contacts allows current to traverse the contact gap in the form of displacement current. This is shown with the following equation (1):

$$i \propto C \times \frac{dV}{dt} \rightarrow C \times \text{frequency} \times \text{amplitude} \quad (1)$$

In equation (1), C is the capacitance across the test unit 105 and V is the instantaneous voltage. As shown, the amount of current is proportional to the derivative of the voltage with respect to time. Accordingly, the current increases linearly with an increase in frequency. By way of equation (1) capacitance versus time as conductive surfaces move with relationship to one another can be provided in accordance with principals of the invention.

The sensitivity of measurement is improved by choosing a higher frequency. Unfortunately, as the physical size of the test apparatus, e.g., the switch, becomes comparable to a wavelength (e.g., larger than 1/10 of a wavelength), standing waves may occur in the system, thereby complicating the analysis. Accordingly, a frequency may be set so that the wavelength of the RF signal is about ten times longer than the physical extent of the apparatus in order to simplify the analysis. However, this should not be considered a limiting feature of the invention.

Using the system of FIG. 1, the output from the switch or other test unit is placed into the log amp 128. Since the log amp 128 processes the voltage produced as a result of the voltage divider formed by the varying capacitive reactance and the termination resistor (e.g., 50 ohms), the output of the log amp 128 may be expressed with equation (2) as follows:

$$\text{Output} = \log\left(\text{amplitude} \times \frac{50}{50 + 1/j\omega C}\right) \rightarrow \quad (2)$$

$$\log(\text{amplitude} \times 50) + \log(\text{frequency}) + \log(C)$$

$$\text{Output} \rightarrow \text{constant} + \log(\text{frequency}) + \log(C)$$

In equation (2), amplitude is the envelope of the RF synthesizer (e.g., a peak to peak measurement) and (50+1/jωc) is a simple voltage divider formed by the series RC circuit. In this equation, the termination impedance is arbitrarily set to be 50 ohms which is a common impedance used for transmission lines. Also the RF frequency may be chosen so that 50<<1/jωC so that the change in C, the varying capacitance due to the moving switch contacts is manifested as a change in RF signal amplitude to the input of the log amp.

Additionally, equation (2) shows that the voltage amplitude may be adjusted and has different limitations as compared to frequency. Accordingly, as should now be understood, there are two independent parameters i.e., frequency and amplitude, that may be adjusted to increase accuracy of the circuit 100, thus providing for a wide range of applications.

Two scenarios for implementing the invention will now be described and are illustrated in Table 1, below. The first scenario includes a small MEMs switch having about a 0.1 pF average parasitic capacitance. The desired time resolution for this MEMs switch may be 100 nsec. The entire length of the apparatus from RF synthesizer output to the input of the log amp 128 is less than about 10 cm in length. For the second scenario, a conventional toggle switch having about a 10 pF average capacitance with an overall apparatus length of less than about 3 feet is provided. The desired time resolution for the toggle switch is about 10 microseconds. It is noted that these are merely examples and other parameters clearly fall within the scope of the invention.

TABLE 1

|  | Case 1 - Small Switch | Case 2 - Large Switch |
|---|---|---|
| Average Capacitance (e.g., midway between open and closed) | 0.01 (pF) | 10 (pF) |
| Desired time resolution & Associated Min RF freq. | 1.00E−07 (sec) 227.3 (MHz) | 1.00E−05 (sec) 2.3 (MHz) |
| RF Amplitude | 0.7 (V) | 0.7 (V) |
| Length of Apparatus & Associated Max RF freq. | 0.1 (m) 300 (MHz) | 1 (m) 30 (MHz) |
| Frequency used (MHz) | 300 (MHz) | 3 (MHz) |
| Log Amp Input (goal is about −40 dBm) | −41 (dBm) | −41 (dBm) |

As shown for Case 1, frequencies ranging from about 227 to about 300 MHz are acceptable. For Case 2, frequencies ranging from about 2.3 to about 30 MHz are acceptable. In both cases, the log amp input is about −41 dBm, which is approximately centered it in its dynamic range. As explained above, frequency and amplitude may be adjusted to obtain the desired log amp output and time resolution.

Figure 2:
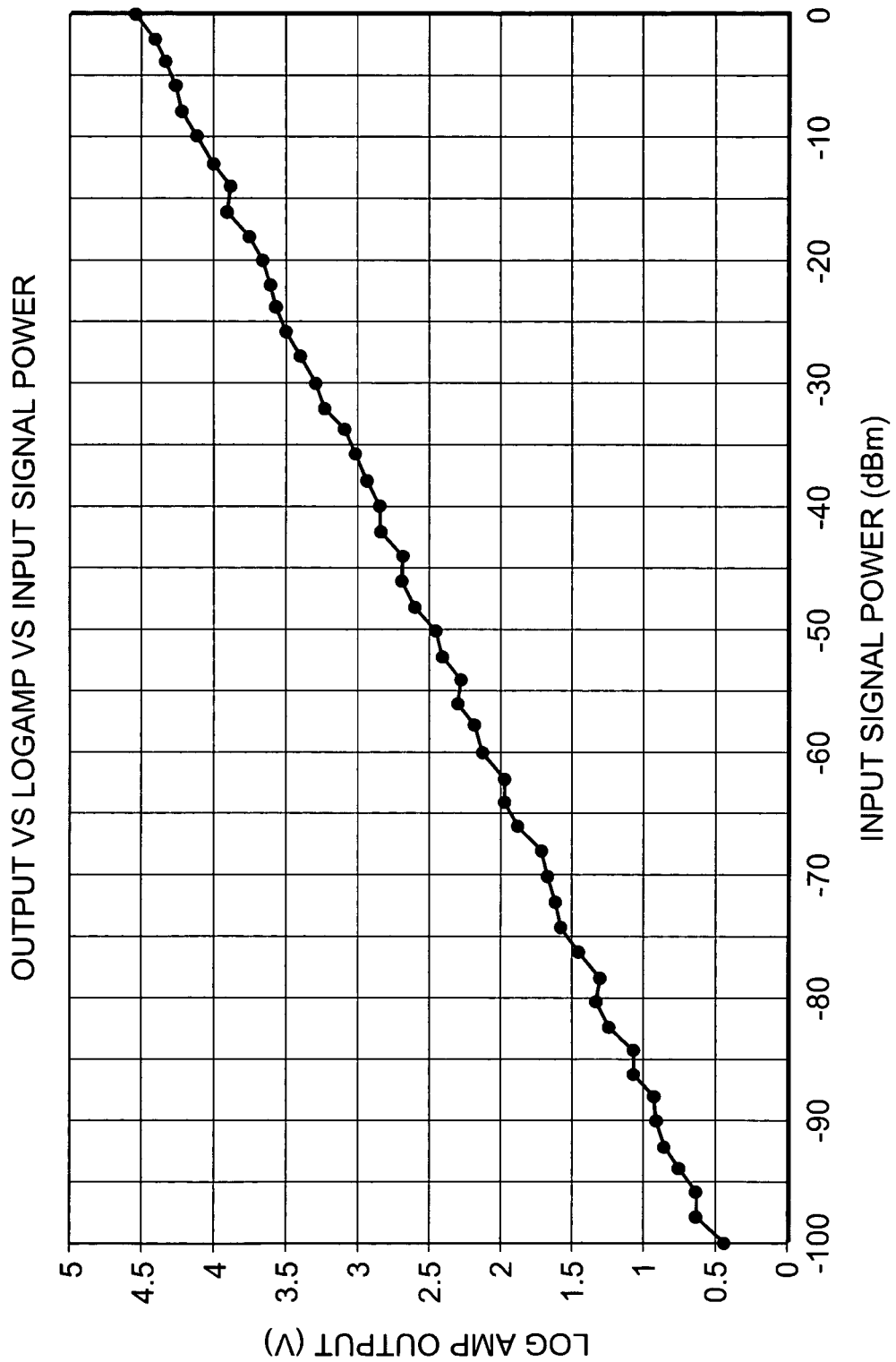
FIG. 2 shows a graph of an output of a log amp versus input signal power.

FIG. 2 shows a graph of an output log amp versus input signal power according to an embodiment of the invention. Referring to FIG. 2, the abscissa shows an input signal power dBm and the ordinate shows a log amp output V at a logarithmic scale. The abscissa axis ranges from about 0 to about −100 dBm, which represents about ten orders of magnitude in RF that are capable of being measured by the log amp 128. Accordingly, by utilizing a log amp a wide range of voltages may be sensed. Of course, other known techniques may be utilized in combination or independently.

Figure 3A:
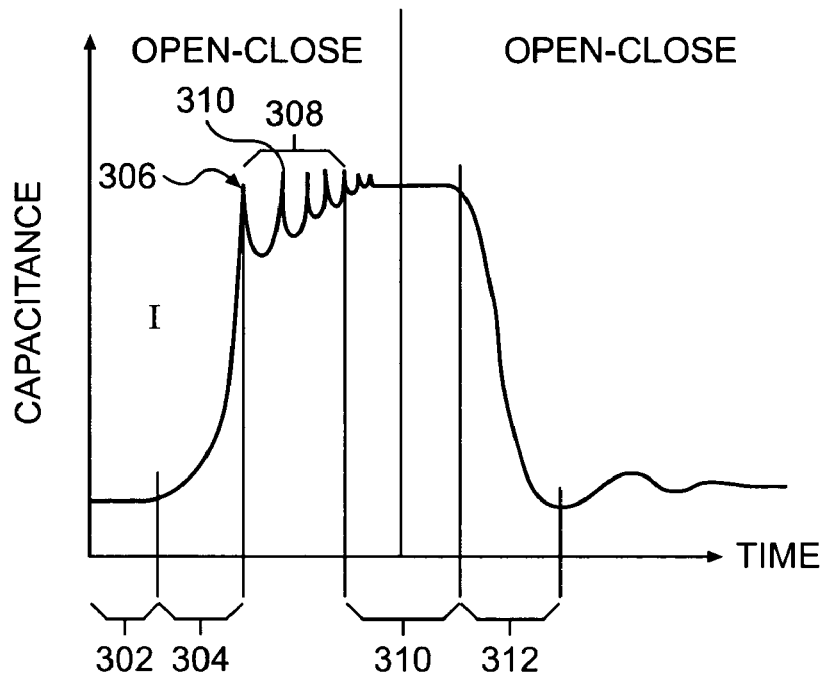
FIG. 3A shows a graph of an output of a log amp as capacitance versus time using the invention.

FIG. 3A shows an example of an output of a log amp as capacitance versus time as the switch opens/closes and suffers from contact bounce. As shown in FIG. 3A, the log amp output is a voltage waveform as a function of time, and the change in capacitance reflects the change in relative mechanical position of the two switch contacts (or other dynamic structures) as a function of time. More specifically, section 302 reflects the capacitance versus time when the switches are far apart. As shown the capacitance is small and only a small displacement current flows across the switch at such a large distance. As the switch starts to close, as represented in section 304, the capacitance between the two contacts increases and thus, more energy from the RF synthesizer travels between the contacts of the switch. The capacitance of the switch is at its greatest in section 306 as the two contacts of the switch make electrical contact. Accordingly, the amount of energy from the RF synthesizer is also at its maximum point and the log amp is also at its optimal or maximum output voltage at section 306.

As described above, bouncing may occur during opening and/or closing of a switch and is represented at section 308. This bounce is represented by fluctuations in the capacitance and thus, depicted as many spikes 310 in section 308. In this embodiment, the frequency of the peaks may increase, but the amplitude becomes smaller as the contacts have a shorter distance to travel between bounces. The cycle of bouncing repeats until the contacts reach a steady-state as represented in section 310, at which time the switch is closed. Finally, section 312 represents the opening of the switch, at which time the capacitance decreases as the contacts separate.

As should now be understood, the output of the log amp reflects the envelope of the wave form which, in turn, reflects the capacitance curve shown in FIG. 3A. Thus, by using the invention, it is possible to determine, in a non-invasive manner, the capacitance across the switch contacts as a function of time as shown by the wave form of FIG. 3A, for example.

Figure 3B:
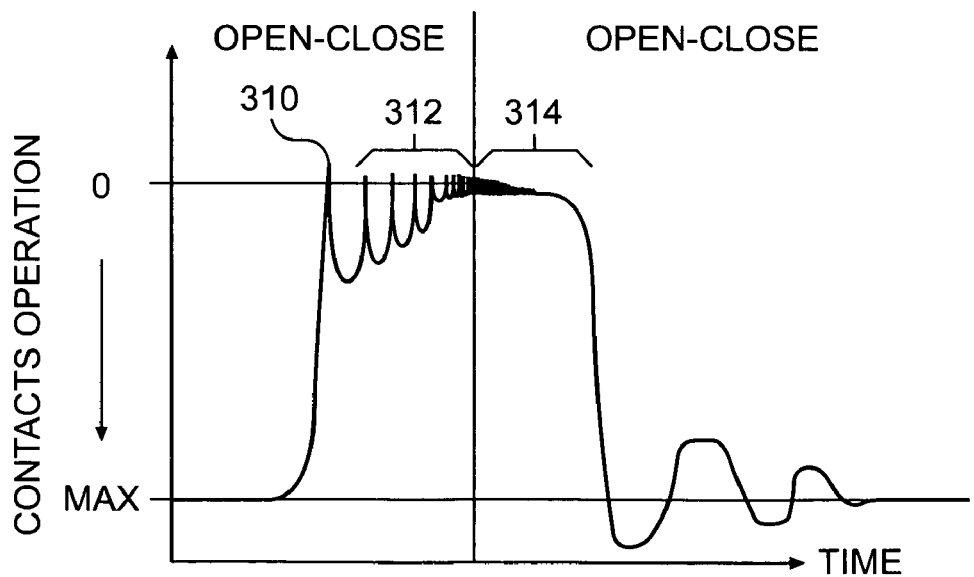
FIG. 3B shows a graph of an output of a log amp as contact separation versus time using the invention.

If more detailed information is desired, it is possible to calibrate the circuit 100 to predict the displacement versus time or other parameters as shown in FIG. 3B. The calibration technique is used to discern the actual displacement between contacts in-situ. In one implementation, for example, calibration may be performed on a representative test unit in a dedicated setting such that the results may be applied to the actual switch under actual conditions. During calibration, the electrical environment of the switch (e.g., parasitic capacitance) may be monitored and recorded to apply the results to an actual use of a similar switch. More specifically, the capacitance for a known position may be monitored and then correlated to a mechanical position of the contact separations.

For example, a micrometer may be used to record a distance between contacts of a switch at various distances. At the known distances, a measurement of the output of the log amp is recorded. After a predetermined number of measurements, a mapping of the various positions versus log amp output is undertaken to provide a 1:1 mapping between log amp output and switch contact displacement. Accordingly, a switch's contact separation as a function of time can be generated as shown in FIG. 3B. By using this information, it is possible to design a switch with reduced bounce, to fine tune debounce algorithms, and/or to size the jet needed to extinguish the arc in a power circuit breaker.

FIG. 3B shows an output of the log amp converted to a waveform representing contact separation as a function of time. In this embodiment, the waveform assumes a 1:1 mapping of capacitance to position. Of course, more complex mapping functions may be utilized if this is not the case. As represented by this waveform when the switches are far apart the contact separation is at a maximum. As the switch starts to close, the contact separation decreases until the switch is closed at 310. The contact bounce effect will occur as represented in section 312. Again, after the first contact bounce, the bounce frequency increases and there is a corresponding decrease in separation amplitude. The contact separation reaches a steady-state at section 314 when the switch is closed and bouncing stops. Again, by using the circuit 100 of the invention, the bouncing effect can be accurately measured and monitored in a non-invasive manner in order to compensate and better understand the dynamics of the desired test unit. In this manner, techniques for compensating for the bounce could be more accurately and precisely developed.

Figure 4:
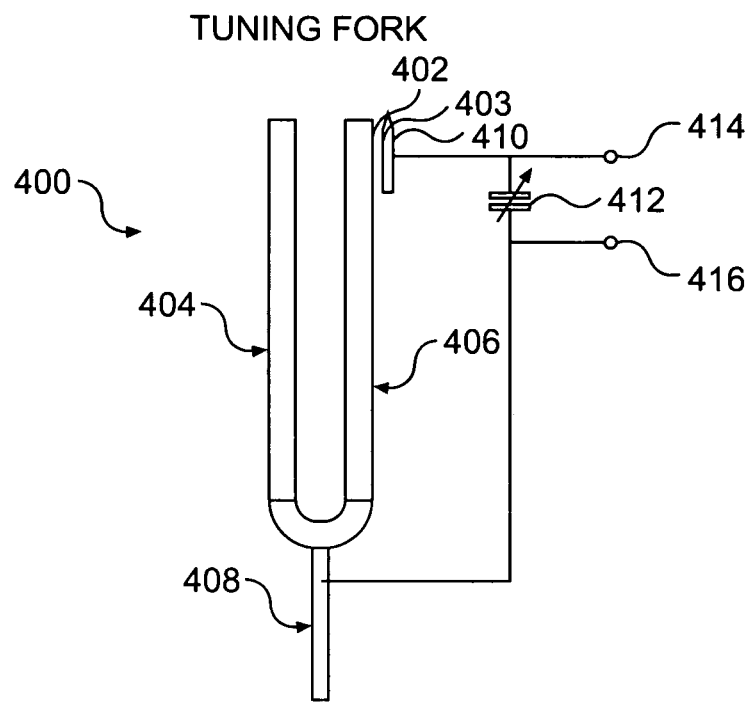
FIG. 4 shows an apparatus for verifying calibration.

FIG. 4 shows an apparatus for verifying calibration of the system 100. In this calibration, a tuning fork 400 is used as a reference since it has a very accurate sinusoidal waveform. The tuning fork 400 includes a first prong 404, a second prong 406, and handle 408. In this configuration, the second tong 406 includes a conductive material 402 on the surface of the second prong 406 and proximate a mechanically stationary electrode 410. Since tuning forks are usually made of metal, the conductive coating 402 is usually not required. A capacitance 412 is created between the surface 403 and the surface of the tine 402; the latter surface can be electrically accessed through the conductive handle 408 in the case of a metallic tuning fork so that the vibrations of the prongs are not affected. In this configuration, the conductive contacts 402, 403 are homologs of the switch contacts, and will display a capacitance therefrom. An input and output 414, 416, respectively, are connected to the system 100 of Figure A via the respective input and output transmission lines 104, 116.

By using a micrometer to precisely deflect the tuning fork prong 406, measurement of the capacitance output can be mapped to the mechanical position of the prong thereby generating a calibration curve. If the mapping is correct, a perfect sinusoidal wave should be produced when the capacitance curve is deconvolved when the tuning fork is struck. This output may be examined by performing a fast fourier transform (FFT) to determine the degree of distortion (s) in the mechanical deflection waveform. By this measurement, calibration of the system 100 can be accomplished.

Figure 5:
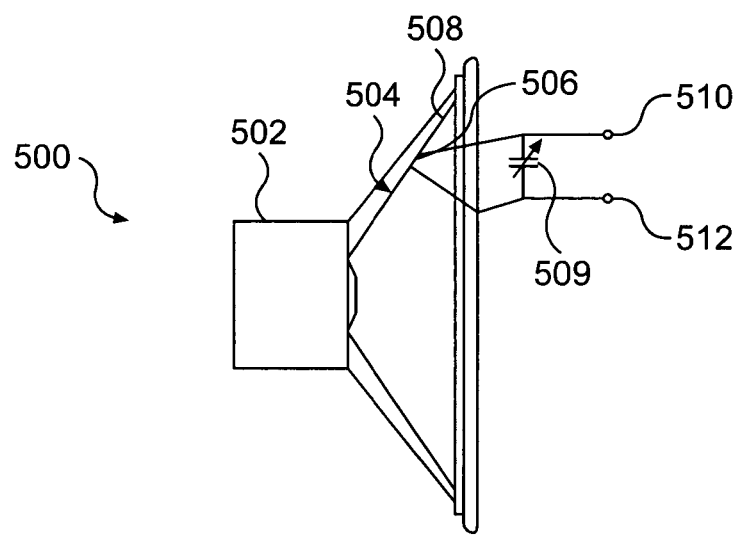
FIG. 5 shows an application according to another embodiment of the invention.

FIG. 5 shows an apparatus to dynamically map a speaker's displacement in accordance with the invention. By using the system 100, speaker performance can be improved. By way of background, speakers use a solenoid-type design to actuate motion including a coil, a magnet, and a cone. The cone may be constructed of plastic, paper, and/or other appropriate material. In operation, current is passed into the coil generating a magnetic field that interacts with a permanent magnet in order to displace the cone, which in turn generates pressure waves to produce sound. But, to increase the sound pressure level (SPL) of a speaker a large amount of air must be moved, which requires the cone to be rapidly displaced at significant distances. However, in operation the cone tends not to move as a single unit, resulting in distortion as the various zones move out of synchronization, thus creating different frequencies and phase fronts. Accordingly, designers need to be able to discern a surface map of a speaker cone as a function of time in order to design a more effective cone. The invention is designed to measure such characteristics, which can then be used to design a more effective speaker.

Referring to FIG. 5, the test unit is now the speaker generally depicted as reference numeral 500. The test unit includes a magnet 502, an internal voice coil (not shown), and a cone 504. A conductive electrode 506 is positioned in close proximity to the surface of the cone 504, with a conductive surface 508 formed on the surface of the cone. The electrode 506 must be free of mechanical resonances in the audio frequency range of interest, and should not couple mechanically to the air pressure waves emanating from the surface of the cone. The conductive surface 508 may be formed with any suitable technique, such as spray on coating, spin on coating, sputtering, and the like. In this configuration, a spray on coating technique is used to form a very thin metallic surface 508 on the cone that will not adversely effect the mechanical characteristics of the speaker cone. The test unit is now equivalent to the switch, that is, the first side of the switch is the conductive surface 508 and the other side of the switch is the electrode 506. In accordance with the above description, a capacitance 509 is generated between the conductive surface 508 and the probe 506. As the cone is displaced, the capacitance will fluctuate.

An input and an output 510 and 512, respectively, are electrically connected to the transmission lines 104 and 116 of FIG. 1, respectively. Then, in accordance with the principles of the invention, an RF frequency is provided in the system in order to achieve a log amp output. Spot measurements may be taken over the entire surface of the speaker cone 504. That is, a plurality of measurements may be taken at different locations. The output can then be mapped and calibrated in accordance with FIG. 3A or 3B in order to determine, for example, capacitance as a function of time and distance as a function of time between the contact surfaces. This requires that phase synchronized data be taken. This mapped information may then be used to design a cone (speaker) with improved sound qualities.

Figure 6:
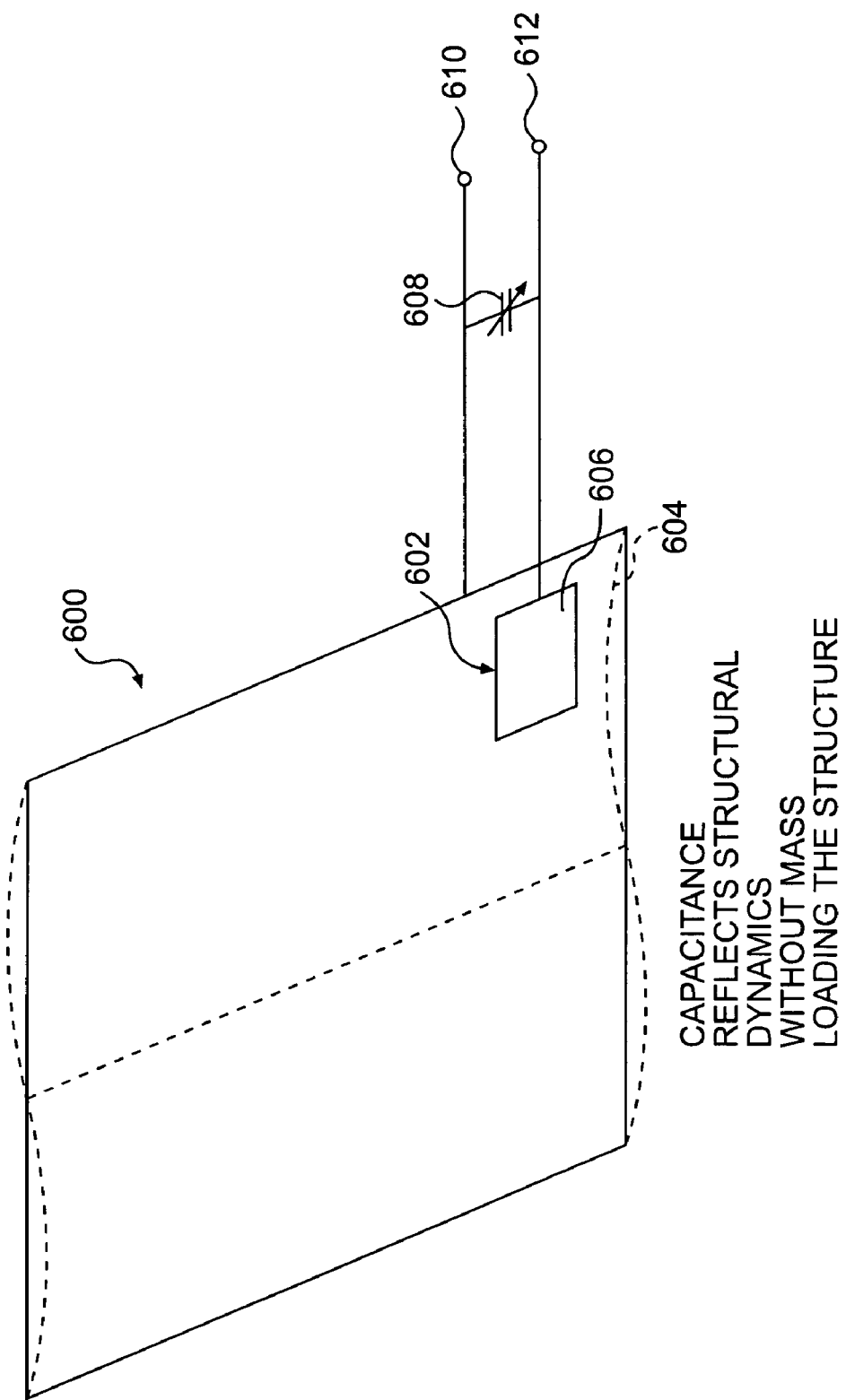
FIG. 6 shows a structural dynamic application according to another embodiment of the invention.

FIG. 6 shows a structural dynamic test unit in accordance with the invention. The test unit is generally depicted as numeral 600 and is provided for measuring structural deformations without loading of the structure. That is, the test unit may deform to a deflection represented as reference numeral 604 under various conditions over time. By using the invention, these deflections can be measured in-situ without loading of the structure.

In this configuration, a conductive probe 606 is arranged over the structure in order to measure a capacitance 608. Much like FIG. 5, the structure to be measured may be coated with a thin conductive material 602 to ensure that the coating does not alter the deformation dynamics. An electrically conductive probe is placed near a surface of the structure being deflected or undergoing motion. The probe is in electrical communication with an input 612. The surface of the structure is electrically connected to an output 610. The input and output are respectively connected to the transmission lines 104 and 116 of the system 100.

A capacitance can now be measured between the electrically conductive surface and the probe, and an area of the structure. This is accomplished, again, by providing an RF signal, via the RF synthesizer, through the test unit and measuring the output of the log amp via the system 100 of FIG. 1. This output can then be converted to waveforms of the capacitance as a function of time and calibrated to determine contact separation as a function of time as shown in FIG. 3A or 3B, respectively. Scanning the electrode 606 across the surface of the structural member produces a map of structural deflections. In this manner, the dynamics of the structure can be determined. This technique may be used for large and small structures and allows analysis of how the structure vibrates in response to mechanical stimulus.

Figure 7A:
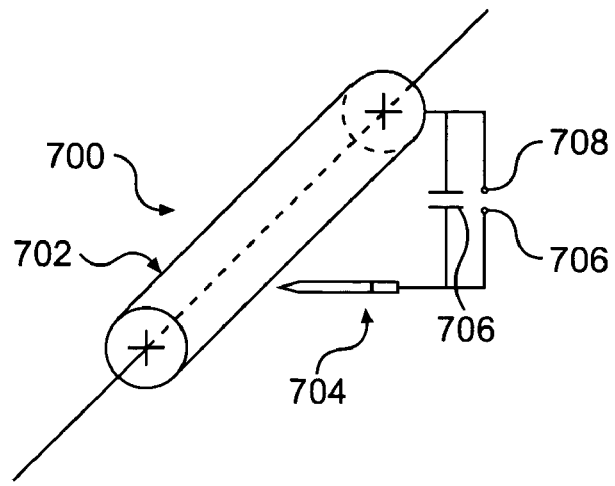
FIG. 7A shows a structural application according to another embodiment of the invention.

FIG. 7A shows a stationary structural application according to another embodiment of the invention. The test unit is generally depicted as reference numeral 700. The structure 702 depicted as a shaft may be coated with a thin conductive material if it is not metallic and conductive probe 704 may be scanned over any surface of the structure 702. A capacitance 706 is then generated between the probe 704 and the portion of the structure 702. The input and output 706 and 708, are connected to the transmission lines 104 and 116 of FIG. 1. Similar to the previously discussed test units, the probe 704 may be scanned across the structure 702 as it is slowly rotated in order to map the profile of the structure using the system 100 of FIG. 1. This information may be converted to waveforms, such as shown in FIGS. 3A and 3B to provide a better understanding of system dynamics. This information can then be used to design a more structurally sound structure and/or to compensate for any structural deficiencies or undesirable aspects, e.g., to provide an accurate map of shaft mounting accuracy or of shaft eccentricity before any dynamic loads are applied.

Figure 7B:
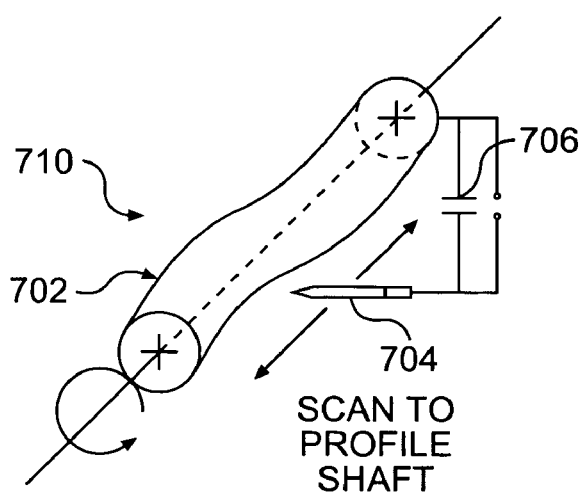
FIG. 7B shows a structural dynamic application according to another embodiment of the invention.

FIG. 7B shows a dynamic structural application according to another embodiment of the invention. In this configuration, the test unit 710 may be representative of a transmission shaft for a turbine engine subject to unbalanced radial forces. Again, the structure 702 may be coated with a conductive material if it is nonmetallic, and probe 704 is provided to measure a capacitance 706 between the probe 704 and the structure 702. The same test setup using the system 100 of FIG. 1 may be utilized with this application.

By utilizing the principles discussed herein, a direct measurement of the shaft during operation and other parameters can be measured as a function of time. For example, the degree of wobbling that the shaft may undergo can be determined. These measurements can then be used to optimize the apparatus and/or design improved apparatuses.

While the invention has been described in terms of embodiments, those skilled in the art will recognize that the invention can be practiced with modification within the spirit and scope of the appended claims.

What is claimed is:

1. An apparatus, comprising:
   a radio frequency (RF) synthesizer outputting a frequency; and
   a log amp in electrical communication with the RF synthesizer via a transmission line, the log amp outputting a voltage converted from an envelope of an RF waveform to determine a capacitance between at least two conductive surfaces
   a protection circuit in electrical communication with the RF synthesizer and the log amp,
   wherein the protection circuit comprises at least one of a direct current (DC) block and termination.

2. The apparatus of claim 1, further comprising a bandpass filter in electrical communication with the RF synthesizer and the log amp, the bandpass filter removing noise which would substantially interfere with an output of the log amp.

3. The apparatus of claim 1, wherein the RF synthesizer outputs a frequency ranging from about 1 MHz to about 1000 MHz.

4. The apparatus of claim 3, wherein the RF synthesizer outputs a frequency ranging from about 100 MHz to about 500 MHz.

5. The apparatus of claim 1, further comprising a test unit in electrical communication between the RF synthesizer and the log amp, the test unit comprising the at least two conductive surfaces.

6. The apparatus of claim 5, wherein the test unit is a mechanical switch including the at least two conductive surfaces.

7. The apparatus of claim 5, wherein the test unit comprises a mechanical structure having the at least two conductive surfaces which have a dynamic relationship.

8. The apparatus of claim 1, wherein the at least two conductive surfaces comprise a probe and a conductive pad or film on a structural surface.

9. The apparatus of claim 1, further comprising means for translating the output of the log amp to capacitance versus time as the at least two conductive surfaces move with relation to one another.

10. The apparatus of claim 9, wherein the means for translating provides a waveform as a function of time, and a change in the capacitance reflects a change in mechanical position of the at least two conductive surfaces.

11. The apparatus of claim 9, further comprising a means for converting the translated output of capacitance versus time to a waveform representing contact separation as a function of time.

12. The apparatus of claim 1, wherein the envelope is a peak to peak measure of the RF waveform.

13. The apparatus of claim 1, wherein the at least two conductive surfaces are in a multipole configuration.

14. An apparatus to measure separation between at least two conductive surfaces, comprising:
a radio frequency synthesizer to generate a narrow bandwidth single frequency;
a first transmission line in electrical communication with the radio frequency (RF) synthesizer;
a testing unit in electrical communication with the first transmission line;
a second transmission line in electrical communication with the testing unit;
a log amp in electrical communication with an output of the second transmission line, wherein the log amp outputs a voltage used to determine the separation between the least two conductive surfaces of the testing unit;
a protection circuit in electrical communication with the RF synthesizer and the log amp, the protection circuit comprising at least one of a direct current (DC) block and termination; and
a bandpass filter in electrical communication with the RF synthesizer and the log amp, wherein the bandpass filter substantially removes noise in the apparatus.

15. The apparatus of claim 14, wherein the RF synthesizer outputs a frequency ranging from about 1 MHz to about 1000 MHz.

16. The apparatus of claim 14, wherein the testing unit comprises one of a mechanical switch, a speaker cone, and a mechanical structure.

17. A method of measuring capacitance across at least two conductive surfaces, comprising the steps of:
providing a movement between a first conductive surface and a second conductive surface;
providing a high frequency signal across the first conductive surface and the second conductive surface via a radio frequency (RF) synthesizer in communication with a log amp via a transmission line;
measuring the amplitude of the downstream signal at the second conductive surface;
converting the measured frequency to a voltage converted from an envelope of an RF waveform and outputted by the log amp;
translating the voltage into a waveform of capacitance versus time as the first conductive surface and the second conductive surface move with relation to one another to determine mechanical separation between the first conductive surface and the second conductive surface over a predetermined time period; and
protecting a circuit in electrical communication with the RF synthesizer and the log amp by providing at least one of a direct current (DC) block and termination.

18. The method of claim 17, further comprising, the steps of:
converting the capacitance versus time to a waveform representing mechanical separation between the first conductive surface and the second conductive surface as a function of time.

19. The method of claim 17, further comprising, the steps of:
optimizing a system performance of a structure associated with the first conductive surface and the second conductive surface based on the waveform representing mechanical separation as a function of time.

* * * * *